United States Patent [19]
Glenn

[11] Patent Number: 6,117,193
[45] Date of Patent: Sep. 12, 2000

[54] OPTICAL SENSOR ARRAY MOUNTING AND ALIGNMENT

[75] Inventor: Thomas P. Glenn, Gilbert, Ariz.

[73] Assignee: Amkor Technology, Inc., Chandler, Ariz.

[21] Appl. No.: 09/422,008

[22] Filed: Oct. 20, 1999

[51] Int. Cl.$^7$ .......................... H01L 21/00; H01L 21/64; H01L 21/66; G01R 31/26
[52] U.S. Cl. ............................................. 29/25.01; 438/16
[58] Field of Search ............................... 29/25.01; 438/16

[56] References Cited

U.S. PATENT DOCUMENTS

| | | | |
|---|---|---|---|
| 4,318,135 | 3/1982 | Allis et al. | |
| 4,457,017 | 6/1984 | Onogi et al. | |
| 4,591,901 | 5/1986 | Andrevski | 358/50 |
| 4,594,613 | 6/1986 | Shinbori et al. | 358/213 |
| 4,803,557 | 2/1989 | Bridges | 358/229 |
| 5,267,043 | 11/1993 | Rottner et al. | 358/214 |
| 5,559,556 | 9/1996 | Kagebeck | 348/374 |
| 5,828,409 | 10/1998 | North et al. | 348/374 |

*Primary Examiner*—David E. Graybill
*Attorney, Agent, or Firm*—Skjerven Morrill MacPherson LLP; Don C. Lawrence

[57] ABSTRACT

A method and apparatus for mounting an optical sensor to, and in optical alignment with, a lens or other imaging-forming element of an optical device includes attaching a fixture to the lens, the fixture having mounting features located thereon at predetermined positions measured relative to the focal plane of the lens, the optical axis of the lens, and the horizontal and vertical axes of a scene imaged by the lens. The absolute locations of the plane, the center, and the horizontal and vertical axes of the sensor array are found within and independently of the sensor package using automated optical pattern recognition apparatus. Using numerically controlled apparatus, complementary mounting features are then milled into the sensor package at positions measured relative to the absolute locations of the sensor features found by the pattern recognition equipment that correspond to the predetermined positions of the mounting features on the fixture measured relative to the optical features of the lens.

34 Claims, 5 Drawing Sheets

OPTICAL SENSOR ARRAY MOUNTING AND ALIGNMENT

BACKGROUND OF THE INVENTION

1. Field of the Invention

This invention pertains to imaging systems in general, and in particular, to a method and apparatus for mounting a solid-state optical sensor array to, and in optical alignment with, a lens or other image-forming element of an optical device.

2. Related Art

The advent of simple, relatively inexpensive semiconductor, or solid-state, optical sensors has wrought a change in the way light images are captured, manipulated, broadcast, reproduced, and displayed. The last decade or so has seen a proliferation in the variety of devices incorporating such sensors that are available, not only to high-end users, such as professional video studios and graphics art houses, but to ordinary consumers as well. Such devices includes video cameras, digital still cameras, desktop scanners, film scanners, bar-code readers, security scanners and the like, that are capable of capturing relatively high resolution monochrome or color images, and converting them into analog or digital signals for storage, manipulation and/or distribution.

Such devices ordinarily comprise a lens or other image-forming element capable of capturing the light from a scene or subject and focusing or projecting that light onto a surface that is capable of sensing the light. This surface typically comprises an array of tiny photosensor elements, such as charge-coupled-devices ("CCDs") or complementary metal oxide semiconductor ("CMOS") photoreceptors. Alternatively, the photosensitive surface might comprise a light-reflecting surface, such as the electrostatic "micro-mirror light valve" described in U.S. Pat. No. 5,768,009 to M. J. Little.

These sensors typically comprise planar, rectangular matrices, or arrays, of photoelectric transducer elements fabricated on the surface of semiconductor substrates, typically silicon, by known photolithographic techniques, that are capable of converting the light energy incident upon them into electrical signals on an element-by-element, or "pixel"-by-"pixel," basis. These signals, usually digital in nature, include information pertaining to, e.g., the intensity, color, hue, saturation, and other attributes of the incident light. Examples of such semiconductor photosensor arrays can be found in the "CMOS active pixel image sensor array" described by B. D. Ackland et al. in U.S. Pat. No. 5,835,141, the "staring array detectors ('SADs')" described by R. S. Holcomb in U.S. Pat. No. 5,864,132, and the "single chip color MOS image sensor" described by D. Chen et al. in U.S. Pat. No. 5,901,257.

The sensor array substrates are typically individually packaged in a hermetically sealed package having signal input/output terminals and a clear glass or plastic lid, or window, that exposes the light-sensitive elements of the sensor below it to the incident light. One such sensor package, known commercially as the Visionpak,™ is described in detail in co-pending U.S. application Ser. No. 08/844,536, filed Apr. 18, 1997, and owned by the same proprietor as this invention.

A common requirement in the assembly of imaging devices such as those described above is that the sensor array be in accurate optical alignment with the lens or other image-forming element of the device in six degrees of measurement, so that the image signal produced by the sensor accurately represents the light information present in the scene imaged by the lens. In particular, the plane of the sensor array must be coplanar with the focal plane of the lens, or the image will be out of focus, the center of the sensor array must be centered on the optical axis of the lens, or the image will be off center or only partially sensed, and the horizontal and vertical axes of the rectangular array must be aligned with the horizontal and vertical axes of the imaged scene, or the image will be canted relative to the actual scene. While some misalignment between the lens and the sensor can be tolerated and/or compensated for electronically by signal processing techniques, it is usually both necessary and preferable to align the sensor optically with the lens during their assembly with as much precision as is cost-justified.

There are generally two methods of aligning an optical sensor to the lens, or image-forming element, of an optical device: A "custom" or "closed-loop" method, and a "blind," or "open-loop" method. In the former, the sensor is temporarily positioned loosely in about the desired position of alignment with the lens, and the sensor is temporarily connected to a display, e.g., a cathode ray tube ("CRT"). The lens then images a test scene or pattern, and the position of the sensor is manually adjusted relative to the lens by a human operator until the image of the test pattern produced on the display subjectively matches the test pattern, whereupon the position of the sensor relative to the lens is then fixed permanently in place, e.g., by screws or an adhesive. Because this method is relatively labor-intensive and requires a skilled operator, it is also relatively expensive, and hence, is typically reserved for relatively expensive devices, such as professional-grade video cameras. Examples of systems in which this "closed loop" method is employed may be found in the scanner mount of U.S. Pat. No. 4,457,017 to T. Onogi et al.; the adjustable mount for a video camera of U.S. Pat. No. 4,803,557 to M. E. Bridges; and in the television camera of U.S. Pat. No. 4,591,901 to Z. M. Andrevski.

The "blind," or "open-loop," method, on the other hand, involves forming or mounting a first fixture on the lens in precise alignment relative to certain optical features of the lens, e.g., its optical axis and its focal plane. The sensor is mounted on a second fixture such that the optical features of the sensor array, e.g., its optical center, are in precise alignment relative to the second fixture. The two respective fixtures have corresponding, complementary mounting features adapted to engage each other such that, when engaged, the optical features of the sensor are aligned with the optical features of the lens.

Typically, the first fixture comprises projections or orthogonal ledges arranged around the optical axis of the lens, whereas, the second fixture comprises corresponding apertures in the package of the sensor, or more typically, in a printed circuit board ("PCB") to which the sensor package is mounted. Applications involving the blind alignment method may be found in the solid state imaging device assembly of U.S. Pat. No. 4,594,613 to K. Shinbori, et al.; in the circuit board/sensor alignment apparatus described in U.S. Pat. No. 5,559,556 to T. Kagebeck; in the film gate apparatus for a color film scanner described in U.S. Pat. No. 5,267,043 to B. E. Rottner, et al.; and the film scanner solid state sensor mount described in U.S. Pat. No. 5,828,409 to S. P. North, et al.

Because the blind method avoids the labor-intensive, trial-and-error techniques of the "custom" method described above, it is typically less expensive to implement on a volume basis than the latter method, and thus makes low-to-medium-cost devices more practicable, e.g., low-end scanners, and still or video cameras. However, because of the potential for tolerance buildup in the fabrication and assembly of the various components of the devices prior to their complete integration, particularly in those present in the solid state sensor itself, it is also typically less accurate than the custom method, unless extremely tight dimensional tolerances are specified and maintained during the fabrication and assembly of all of the components in the "chain" between the sensor and the lens.

The sources of this tolerance build-up can be broken down into two groups: Those "direct" tolerances associated with the fabrication of the individual components, and those "relative" tolerances associated with the assembly of the components to each other. The first group includes the tolerances associated with the sensor array itself, the sensor chip, the chip package, the PCB to which the package is mounted, the sensor-engaging fixture on the lens, and the lens itself. The second group includes the relative tolerances between the sensor array and the chip, the chip and the chip package, the chip package and the PCB, the PCB and the sensor-engaging fixture, and sensor-engaging fixture and the lens.

Because maintaining extremely small dimensional tolerances throughout this entire chain of components is both difficult and expensive, such a requirement can more than offset the cost advantage of the blind alignment method.

What is needed, then, is a simple, low-cost method of blind mounting a solid state optical sensor to a lens or other imaging-forming element of an optical device in relatively precise optical alignment therewith that bypasses some of the above sources of tolerance buildup, so that the need for holding extremely tight mechanical tolerances throughout the assembly chain of the component parts of the device is eliminated.

SUMMARY OF THE INVENTION

This invention provides a method and apparatus for blind mounting a packaged optical sensor array to, and in precise optical alignment with, a lens or other image-forming element of an optical device that eliminates a substantial portion of the tolerance buildup associated with the methods and apparatus of the prior art, and hence, permits the manufacture of relatively low cost, but precisely aligned, solid state imaging devices.

The method comprises attaching a fixture to the lens for mounting the package of the sensor array to the lens. The fixture has mounting features located at predetermined positions measured relative to the focal plane of the lens, the optical axis of the lens, and the horizontal and vertical axes of a scene imaged by the lens. In one preferred embodiment, this fixture comprises a plurality of projections located outboard of the lens, the projections having distal ends that extend toward the focal plane of the lens and parallel to its optical axis.

Importantly, the method also comprises finding the absolute locations of the plane, the center, and the horizontal and vertical axes of the sensor array within, and independently of any mechanical features of, the sensor package, using automated optical pattern recognition methods and apparatus.

When the absolute locations of the above optical features of the sensor array have been found, complementary mounting features are formed into the package of the sensor array at positions measured relative to the absolute locations found of the plane, the center, and the horizontal and vertical axes of the sensor array, which positions are made to correspond to the predetermined positions of the mounting features on the lens measured relative to the focal plane of the lens, the optical axis of the lens, and the horizontal and vertical axes of a scene imaged by the lens, respectively. In one preferred embodiment of the method, the complementary mounting features on the sensor package comprise recesses milled into the package of the sensor array at the desired positions using computer-controlled milling apparatus that is positioned in accordance with the absolute sensor array optical feature location data determined and supplied to the milling apparatus by the automated optical pattern recognition equipment.

The recesses, which may comprise bores or slots formed into the clear window, or lid, of the sensor package, are adapted to receive the corresponding projections of the fixture on the lens in complementary engagement such that, when the projections on the lens are fully engaged with the complementary recesses in the sensor array package, the sensor array is held mounted to the lens, with the plane of the sensor array coplanar with the focal plane of the lens, the center of the sensor array coincident with the optical axis of the lens, and the horizontal and vertical axes of the sensor array aligned with the respective horizontal and vertical axes of a scene imaged by the lens.

In a preferred embodiment, it is desirable to ensure that the sensor array package can be mounted to the lens in one, and only one, correct orientation. This can be achieved by locating the respective complementary mounting features on the lens and the sensor package at radially asymmetrical positions relative to the optical axis of the lens and the center of the sensor array, respectively, or alternatively, if they are located radially symmetrically, by keying at least one pair of the projections and recesses so that they can engage only with each other.

A better, more detailed understanding of these and other features and advantages of the present invention may be obtained by a consideration of the detailed description of it that follows below, particularly if such consideration is made in conjunction with the associated drawings of the invention. A brief description of those drawings now follows.

DETAILED DESCRIPTION OF THE INVENTION

Figure 1:
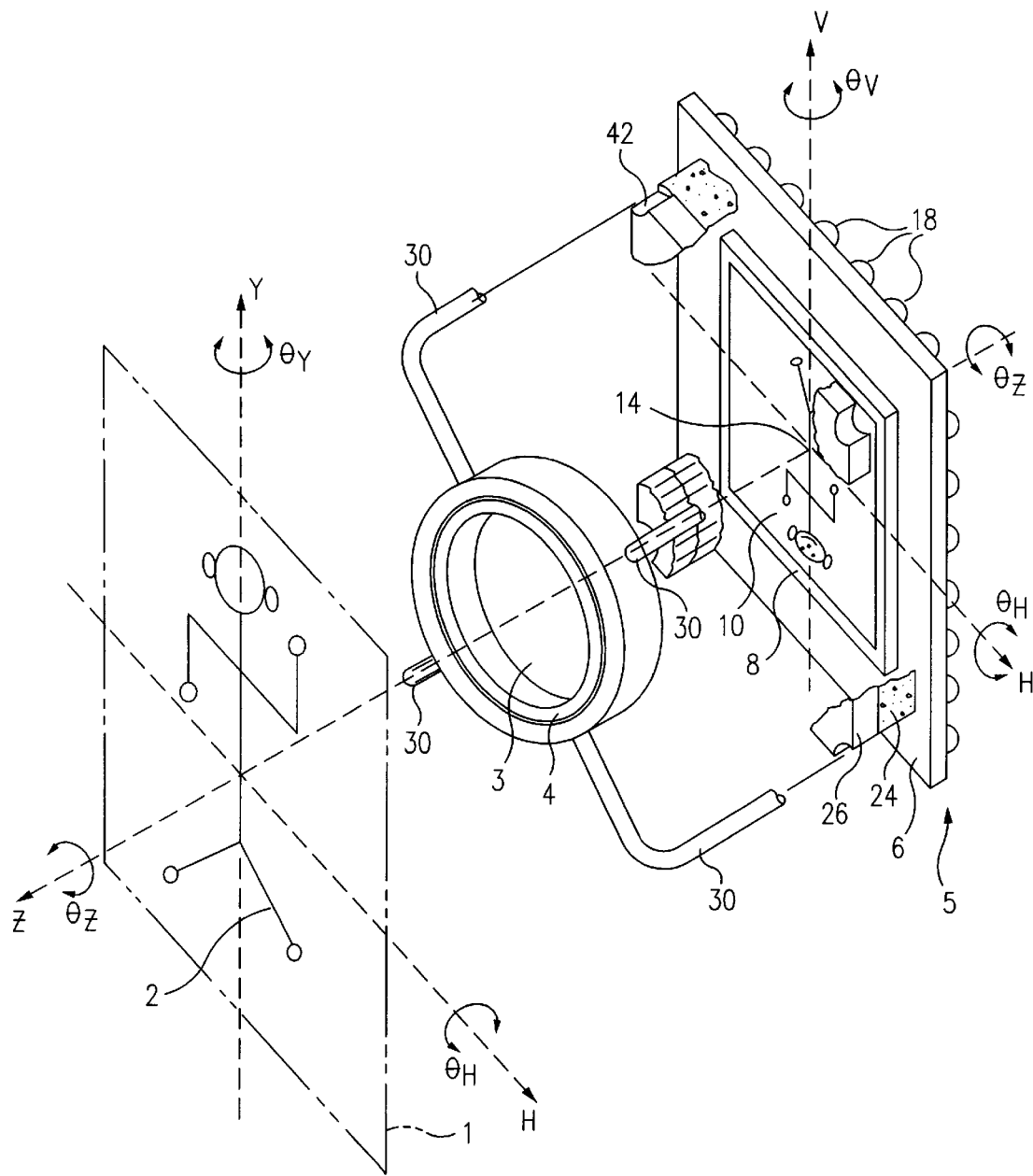
FIG. 1 is perspective view of a figure in a scene being focused by a lens onto the sensor array of a solid state sensor array package that is mounted to and in optical alignment with the lens in accordance with the method and apparatus of the present invention.

FIG. 1 is a perspective view of a two-dimensional scene 1 containing an element 2 being focused by a lens 3 of a camera 4 onto the sensor array 10 of an optical sensor package 5, wherein the sensor package 5 is mounted to and in optical alignment with the lens 3 in accordance with the method and apparatus of the present invention.

In FIG. 1, the image-forming element 3 is shown schematically as a simple, refracting lens 3. However, in other optical devices, the image-forming device might comprise a "pin-hole" lens, or an elongated slit of the type found in the gate of some film or bar-code scanners. Accordingly, although a simple, single-element lens 3 is shown and described throughout the description herein, it should be understood this invention is not limited to this particular type of image-forming element.

The particular sensor package 5 shown in FIG. 1 is a ball grid array ("BGA") type of optical sensor package sold commercially under the name, Visionpak,™ but it should also be understood that the present invention is not limited to this particular type of package, but has application to other types of sensor packages as well, such as through-pin grid array ("PGA") packages, or conventional quad-flat ("QFP") packages, and other types that are known in the art.

Figure 2:
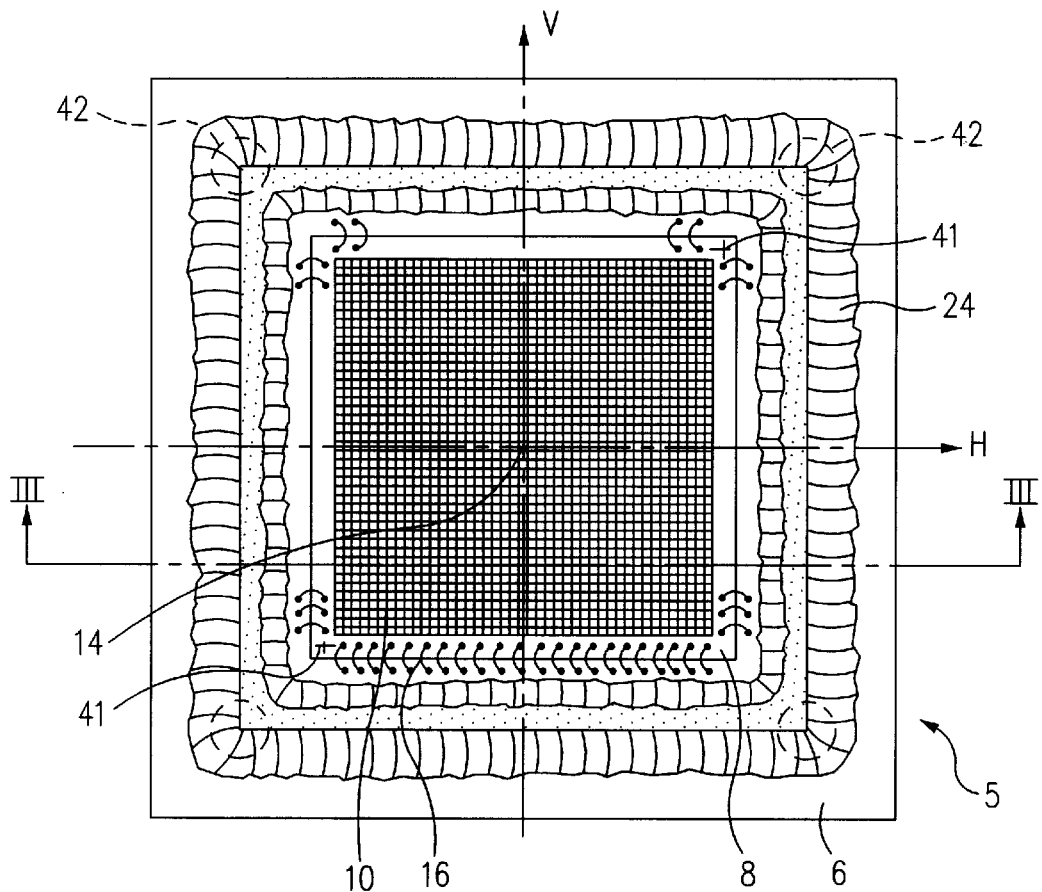
FIG. 2 is a top plan view of an optical sensor array package of one type that is contemplated by the present invention.
Figure 3:
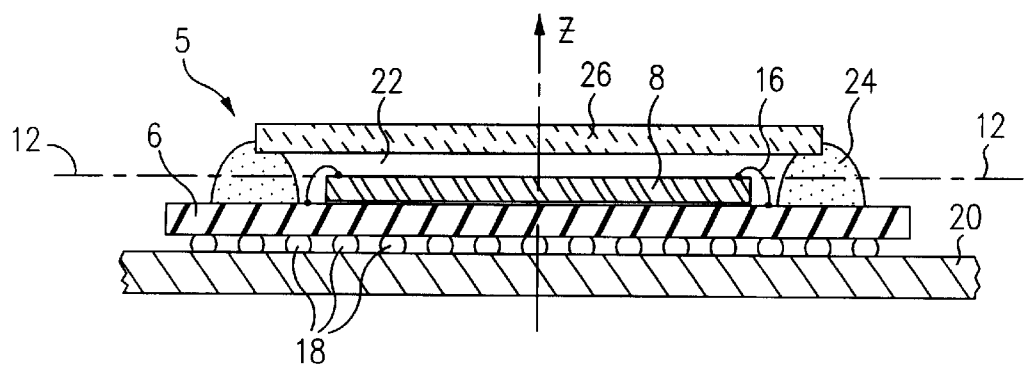
FIG. 3 is a cross-sectional elevation view of the sensor package shown in FIG. 2, as revealed by the section taken along the line III—III therein.
Figure 4:
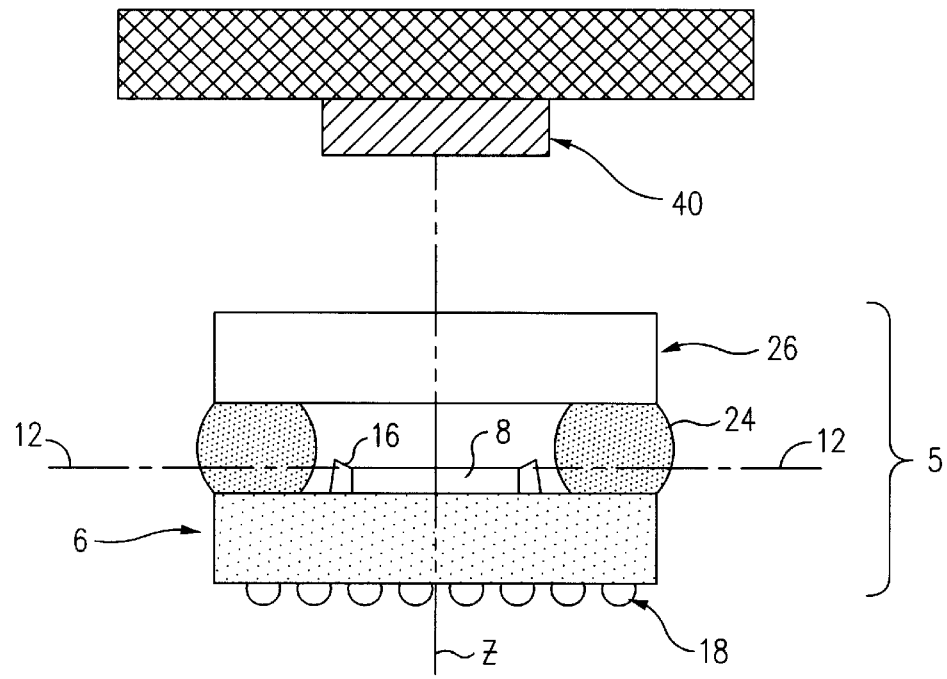
FIG. 4 is a side elevation view of an optical pattern recognition apparatus scanning an optical sensor package to locate the absolute positions of its plane, center, and horizontal and vertical axes in accordance with the present invention.

The sensor package 5 is shown in a top plan view in FIG. 2 and in cross-section in FIG. 3, as revealed by the section taken along the lines III—III in FIG. 2. The package 5 comprises an insulative substrate 6 having a semiconductor chip 8 attached to its upper surface, typically by an epoxy adhesive. The substrate 6 may be made of a ceramic material, e.g., silicon dioxide, a metal, e.g., Kovar, or a composite, e.g., resin and fiberglass.

The semiconductor chip 8 has a two-dimensional, rectangular sensor array 10 comprising a large number of photo sensors formed in it that are each capable of converting the light incident upon it into an electrical signal that is proportional to the intensity, and in the case of a color camera or the like, the color and hue of the incident light. The individual photo sensors may be, among others, CCDs or CMOS devices that are formed by photolithography techniques that are known in the art. Signal processing circuitry (not illustrated) is typically provided external to the sensor for converting the signals generated by the photo sensors into, typically, a digital signal capable of being stored, processed, or distributed as a "pixel," or small, rectangular element, of the imaged scene 1.

It may be seen in FIG. 2 that the sensor array 10 lies in a plane 12 corresponding to the top surface of the chip 8 (see FIG. 3) and has an optical center 14 located at the geometric center of the array. It should be noted that, while the center 14 of the sensor array 10 is shown coincident with the centers of both the underlying chip 8 and the substrate 6, it may be that, in some cases, the center 14 of the array will be offset from the centers of the chip 8 and/or the substrate 6. This is because it may be desirable in some applications to include additional, space-occupying circuitry on the chip 8 itself, and/or an additional chip on the substrate 6 that is dedicated to, e.g., signal processing, sampling, or rastering functions, and the like. The sensor array 10 may further be thought to have associated with it a set of three orthogonal axes that intersect at the center 14 of the array: a horizontal axis H, a vertical axis V, both of which lie in the plane 12 of the array, and a Z axis that is orthogonal to that plane.

Figure 6:
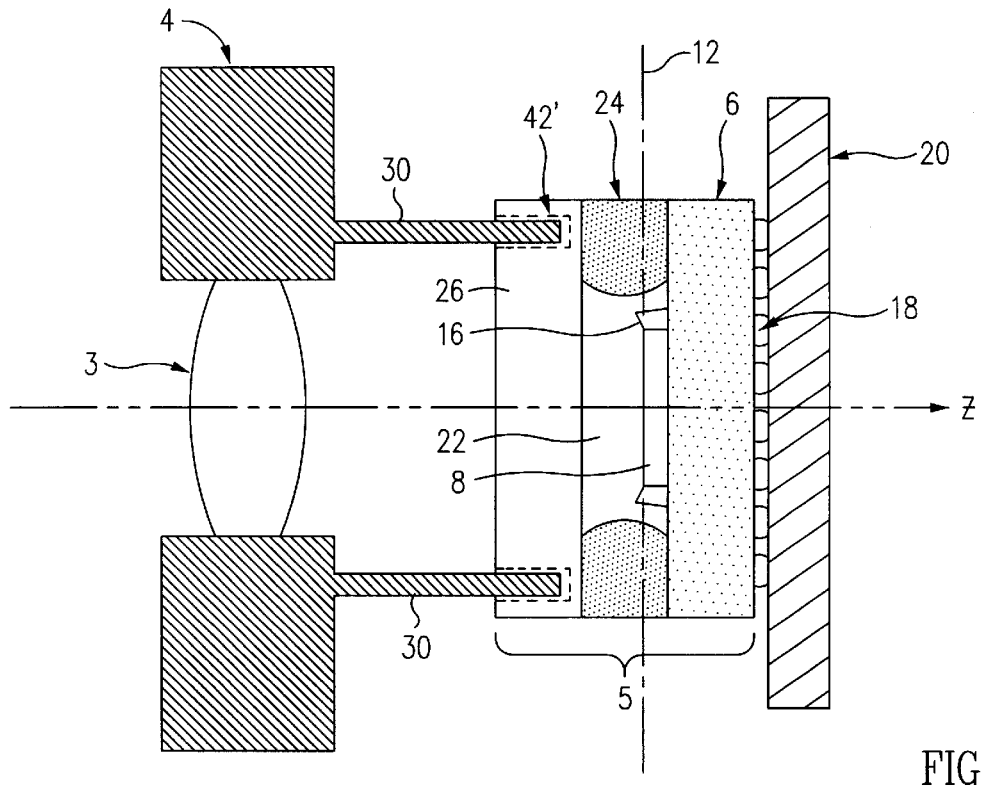
FIG. 6 is side elevation view of an optical sensor package mounted to and in optical alignment with a lens in accordance with one embodiment of the present invention.
Figure 7:
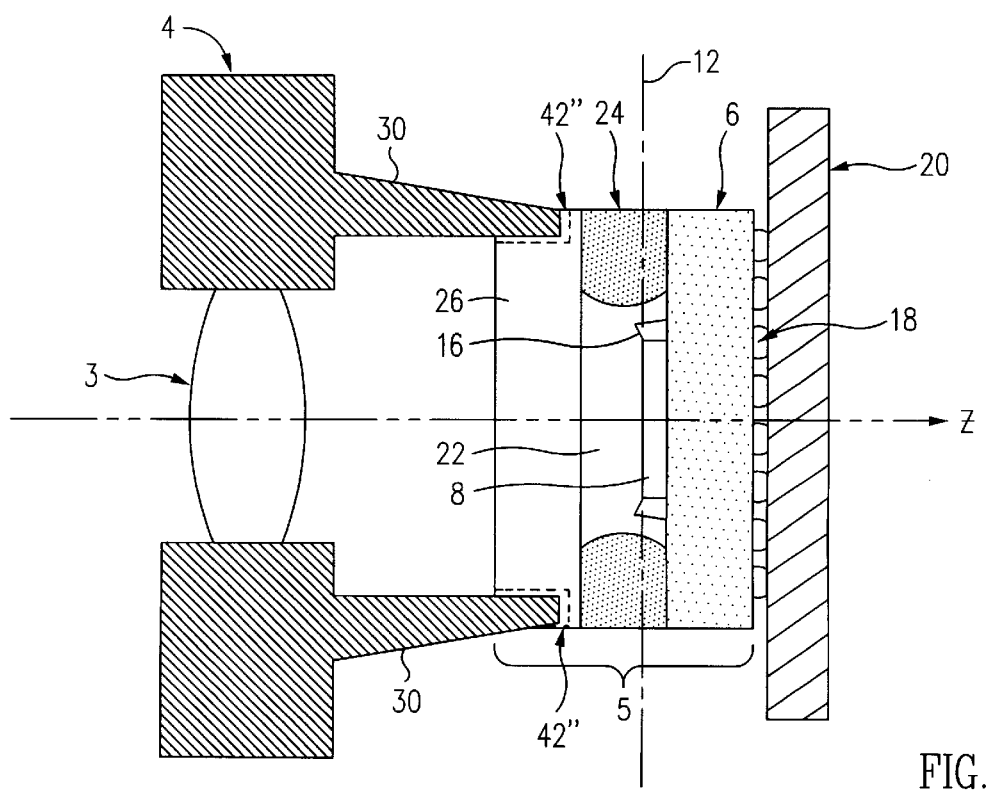
FIG. 7 is a side elevation view of an optical sensor package mounted to and in optical alignment with a lens in accordance with another embodiment of the present invention; and, FIGS. 8–10 are enlarged, side elevation views of various embodiments of the complementary mounting projections and recesses of the present invention.

The upper surface of the substrate 6 of the sensor package 5 typically includes a plurality of conductive traces (not illustrated) to which the circuitry of the array 10 is electrically connected by a plurality of fine conductive wires 16 that are bonded at opposite ends to pads on the upper surface of the chip 8 and to pads on the upper surface of the substrate 6, respectively. The wires 16 carry electrical power and signals between the sensor array 10 and the ambient circuitry (not illustrated), and to this effect, the substrate 6 of the package typically includes a plurality of conductive, plated-through "via" holes (not illustrated) to convey the power and signals to the bottom surface of the substrate 6, where, in a BGA package, they in turn connect to a plurality of solder balls 18 formed on the bottom surface of the substrate 6. The solder balls 18 function as electrical input/output terminals of the sensor package 5, and also, to mount and connect the sensor package 5 to, e.g., an associated power and control PCB 20, such as shown in FIGS. 3, 6 and 7.

After the chip 8 has been mounted and electrically connected to the substrate 6, it is desirable to protect the delicate circuitry of the sensor array 10 and the bonded wires 16 from harmful environmental elements, such as moisture, yet permit image light incident on the package to reach the underlying sensor array 10 unchanged in its optical properties. This is achieved in the exemplary optical BGA package illustrated by enclosing the chip 8 and the bonded wires 16 within a sealed chamber 22 defined by side walls 24, comprising a strong epoxy resin, and a transparent lid, or window 26, mounted on the top surface of the side walls 24.

In the package 5 illustrated, the chamber 22 is created by running a continuous bead 24 of a fairly viscous epoxy resin around the margin of the upper surface of the substrate 6 outside of the chip 8 and the connection wires 16, and then placing the transparent window 26 in contact with the top surface of the bead and maintaining it there while the epoxy bead is cured, thereby attaching the window 26 permanently to the substrate above the chip 8. The window 26 may be made of glass, quartz, diamond, sapphire, or a clear, hard plastic, such as an acrylic. In some applications, it may be desirable to evacuate the chamber 22, whereas, in others, it may be desirable to fill the chamber 22 with a special-purpose gas, such as dry Nitrogen, Argon or the like, depending on the particular application.

Returning to FIG. 1, a conventional refractive lens 3 of a camera 4 will focus light reflected or emitted by an element 2 of a two-dimensional scene 1 onto a focal plane (not illustrated) that is orthogonal to the optical axis Z of the lens 3 and located a specific distance (viz., the "focal length" of the lens) behind the lens. The element 2 in the scene 1 may be thought to lie in a plane that is defined by two orthogonal axes, a horizontal axes H and a vertical axis V that intersect at the center of the scene, and to be orthogonal to a third, intersecting axis Z perpendicular to the H and V axes.

For the sensor array 10 to accurately sense the image of the element 2 in the scene 1 imaged by the lens 3, the sensor array must be aligned with the lens such that the plane 12 of the sensor array (see FIGS. 3–7) is coplanar with the focal plane of the lens, or the image will be out of focus. Further, the center 14 of the sensor array 10 must be centered on, or coincident with, the optical axis Z of the lens, or the image will be off center or only partially sensed. And finally, the horizontal and vertical axes H and V of the rectangular array 10 must be aligned with the horizontal and vertical axes H and V of the scene imaged by the lens 3, or the image sensed will be canted relative to the original scene.

Thus, it may be seen that the task of optically aligning the sensor array 10 with the lens 3 involves controlling the position of the array relative to the lens in six directions of movement, three linear, viz., along the X, Y, and Z axes of the array, and three angular, or rotational, viz., $\Theta_X$, $\Theta_Y$, and $\Theta_Z$, about those three respective axes.

The two methods employed by the prior art to deal with this alignment task are described in detail above, namely the "custom" alignment method, and the "blind" alignment method. As discussed above, the blind method incurs a substantial buildup of tolerances between the sensor array 10 and the lens 3 to which it is aligned, and typically necessitates holding relatively small, or precise, relative tolerances in the mounting of the chip 8 to the substrate 6, the mounting of the sensor package 5 to the underlying sensor electronics PCB 20, and the mounting of the PCB 20 to the lens 3. The following is a description of how the present invention eliminates, or "bypasses," much of this tolerance buildup.

Initially, a fixture for mounting the package 5 of the sensor array 20 on the lens 3 is formed on, or attached to, the lens. The fixture comprises a plurality of mounting features 30 for engaging the package of the sensor array at predetermined positions measured relative to the focal plane of the lens, the optical axis Z of the lens, and the horizontal and vertical axes H and V of the scene 1 imaged by the lens.

In one preferred embodiment, the mounting fixture comprises a plurality of standoffs, or projections 30, preferably at least three in number, that are arrayed around the optical axis Z of the lens 3 at distinct, predetermined polar coordinates measured relative to that axis and the horizontal and vertical axes of the scene 1 imaged by the lens 3. The projections 30 have distal ends 32 that extend toward the focal plane of the lens in a direction parallel to its optical axis Z, and include two mechanical features, which are described below, that are used to optically align the sensor array 10 with the lens 3.

Figure 8:
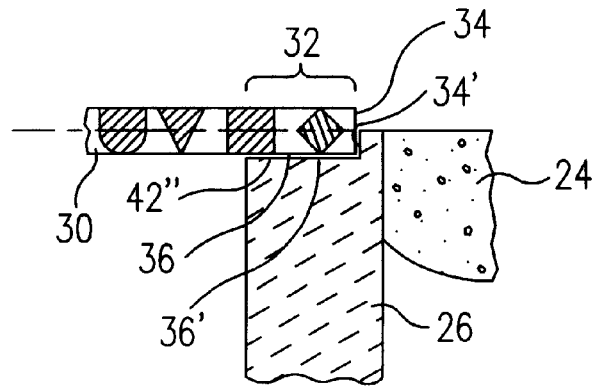
Figure 9:
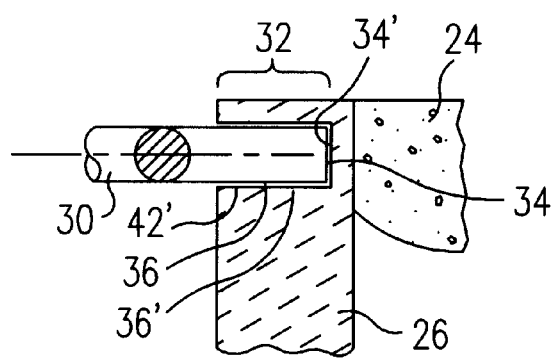

Depending on the manner in which the distal ends 32 of the projections 30 are terminated, the first of these features 34 is either a planar element 34 located at the very distal end 32 of each projections 30, or the frustrum 34 of a cone. Thus, in the case of projections 30 that are terminated at a right angle to the long axis of the projection, the first feature 34 consists of a small, planar, circular or polygonal element, depending on the cross-sectional shape of the projection, as illustrated in FIGS. 8 and 9. In the case of projections that are terminated with a taper, e.g., a conical termination such as that illustrated in FIG. 10, the first alignment feature 34 is the frustum of a cone.

Regardless of their form, however, it will be understood that, if the length of the projections 30 is made equal, and slightly less than the focal length of the lens 3, then at least three of these first alignment features 34 will define a plane that is parallel to the focal plane of the lens 3. Further, if these first features 34 are engaged with corresponding, complementary alignment features in the sensor package 5 that are appropriately located relative to the plane 12 of the sensor array 10, then the plane 12 of the sensor array 10 will be positioned such that it is coplanar with the focal plane of the lens 3.

Figure 10:
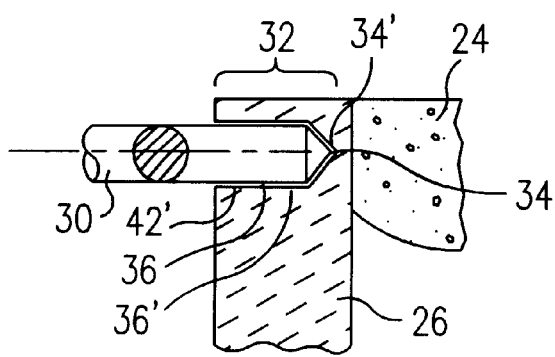

The second feature 36 of the distal ends 32 of the projections 30 used in the present invention to optically align the sensor array 10 with the lens 3 comprises the outer surfaces of the distal ends 32 of the projections 30 that contact the sensor package 5 (See FIGS. 8–10).

In a first aspect of these second alignment features 36, it will be seen that they are each located at a predetermined radial distance from the optical axis Z of the lens 3. Thus, if these second features 36 are engaged with corresponding, complementary features in the sensor package 5 that are located at identical radial distances relative to the center 14 of the sensor array 10, then the center 14 of the sensor array 10 will be positioned such that it is coincident with the optical axis Z of the lens 3.

In a second, related aspect of these second alignment features 36 of the distal ends 32 of the projections 30, it will be seen that they are each oriented at a predetermined angular orientation relative to the horizontal and vertical axes H and V of a scene 1 imaged by the lens 3. Therefore, if these second features 36 are engaged with corresponding, complementary features in the sensor package 5 that are located at identical, corresponding angular orientations relative to the horizontal and vertical axes H and V of the sensor array 10, then the horizontal and vertical axes H and V of the sensor array 10 will be positioned such that they are aligned with the horizontal and vertical axes H and V, respectively, of a scene 1 imaged by the lens 3.

The projections 30 may be formed as an integral fixture that mounts to the lens 3, e.g., a bezel or other support for the lens, such as the configuration illustrated in FIG. 1. Alternatively, the projections 30 may be individually constructed and attached to the lens 3, one at a time. In yet another alternative embodiment, the projections can be integrally and simultaneously formed on a body supporting the lens 3, such as a cast or molded camera or scanner body.

When the configuration of the mounting features 30 and their location relative to the respective optical features of the lens 3 and the image 1 have been determined, it is then necessary to form the corresponding, complementary mounting features on the sensor array package 5 described above for engaging the fixture such that the sensor array 10 is mounted to, and in optical alignment with, the lens 3. This invention departs from the methods and apparatus employed by the prior art for accomplishing this alignment task in, among other things, the method used to locate the sensor array 10 relative to the lens 3 and in the method used to form the complementary mounting features on the package 5.

In particular, the prior art relies on a "dead-reckoning" method, in which the sensor array 10 is located relative to two orthogonal edges of the chip 8, which in turn, is typically positioned relative to the substrate 6 by bringing those two orthogonal edges of the chip into contact with mechanical features, such as ledges or pins, located on the substrate. These latter mechanical features, in turn, are located on the substrate relative to the features used to mount the substrate 6 to corresponding mounting features on the lens 3, either directly, or indirectly through a PCB 20, which in turn, mounts directly to the lens 3.

The method of the present invention bypasses the above "relative position" tolerance buildup by first packaging the chip 8 in the sensor package 5, then locating the absolute positions of the essential sensor array optical features independent of any mechanical features on the package, the substrate 6, or the sensor-mounting PCB 20 using automated pattern recognition equipment, and then forming the corresponding, complementary mounting features in the sensor package 5 relative to those absolute locations. This is illustrated schematically in FIG. 4, where an optical pattern recognition camera 40 is shown scanning the top surface of the sensor chip 8 through the clear window 26 of the fully assembled sensor package 5 to find the absolute locations of the plane 12, the center 14, and the horizontal and vertical axes H and V of the sensor array 10 inside of the package. Those skilled in the art will recognize that such automated pattern recognition equipment is already in fairly wide use throughout the semiconductor manufacturing industry for such purposes as, for example, wafer sawing, "pick-and-place" attachment of dies and other component, wire bonding, and the like.

Preferably, the pattern recognition apparatus locates the optical features of the sensor array 10 by focusing directly on the features of the array itself, which is visible through the transparent window 26. However, in some cases, it may be desirable to provide one or more additional, more highly visible, array feature locating "targets," such as the crosses 41 located at two diagonal corners of the array 10 shown in FIG. 2. These locating targets 41 can be formed with great precision relative to the sensor array 10 concurrently with its formation using, e.g., the same photolithography techniques used to form the array itself.

Once found, the absolute locations of the optical features of the sensor array of each sensor package 5 are stored for future use, and the pattern recognition apparatus 40 is then ready to scan the next package 5, while the previously-scanned package moves on to a milling station for formation of the corresponding, complementary mounting features in the package. In an alternative setup in which the scanning and milling functions are integrated, the pattern recognition scanning apparatus 40 can be mounted on a head that is moved away from the scanned package to permit a movable milling head to move into position above the package to form the complementary mounting features, all or any part of which processes can be automatically controlled by a computer.

Figure 5:
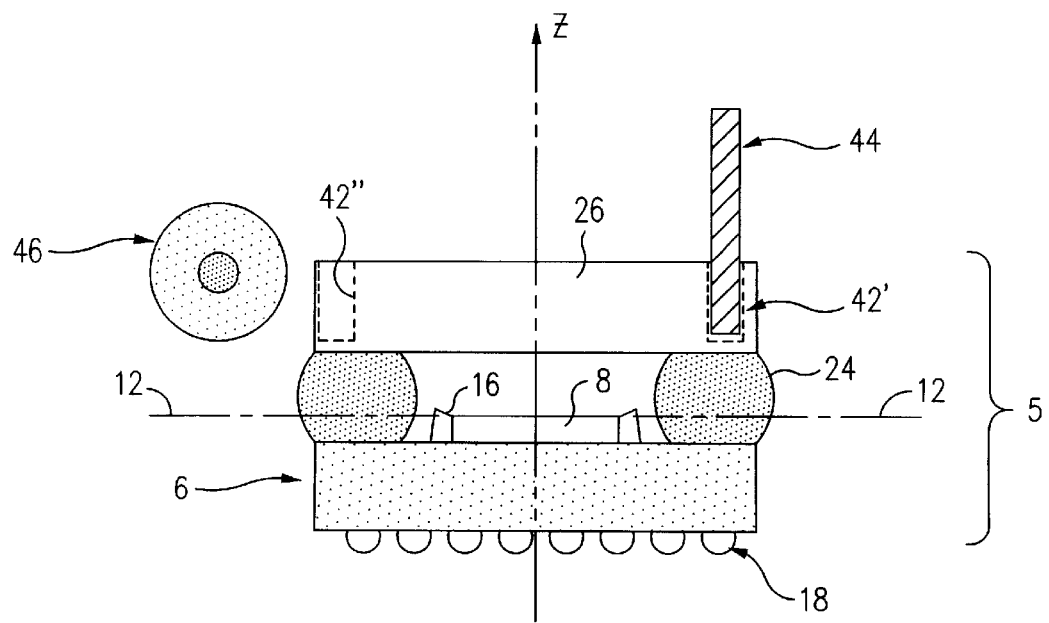
FIG. 5 is a side elevation view of mounting recesses being milled into the window of the sensor package of FIG. 4 using computer-controlled milling apparatus.

The next stage, illustrated schematically in FIG. 5, involves forming the corresponding, complementary mounting features 42 in the package 5 of the sensor array 10 at positions measured relative to the absolute locations of the sensor array 10 features found by the pattern recognition equipment 40 above. In one preferred embodiment, these features comprise recesses 42 formed at positions corresponding to the predetermined positions of the projections 30 on the lens 3 described above, as measured relative to the focal plane and the optical axis Z of the lens 3, and the horizontal and vertical axes H and V of a scene 1 imaged by the lens 3, respectively.

The recesses 42 are preferably milled into the package 5 of the sensor array 10 at their respective polar coordinate positions and to their respective depths using computer-controlled milling apparatus 44, 46 that is positioned in accordance with the absolute sensor array feature location data determined and supplied to the milling apparatus by the automated optical pattern recognition apparatus 40 described above, combined with the pre-programmed, pre-determined positional information relating to the projections 30. In the exemplary embodiment illustrated in the figures, the recesses 42 may comprise either a cylindrical bore 42', milled by a cylindrical boring tool 44, or an open-sided slot 42", milled by a wheel cutter 46, either of which is located at a margin of the clear window 26 of the sensor package 5 (see FIGS. 5 and 8–10).

It will be seen that the recesses 42, regardless of their type, include first and second mechanical alignment features 34' and 36' that complement respective ones of the first and second mechanical alignment feature 34 and 36 on the distal ends 32 of the projections 30 described above.

In particular, each of the recesses 32 comprises a flat "floor" 34, in the case of either a cylindrical bore 42', or a semicircular, rectangular, or V-shaped slot 42", as illustrated in FIGS. 8 and 9, or the frustum 34' of a cone, in the case of a conical bore, as illustrated in FIG. 10, that complements the first distal end feature 34 on the distal ends 32 of the projections 30. By appropriately controlling the depth of the recesses 42 relative to the absolute location of the plane 12 of the sensor array 10, these first recess features can be made to lie in a plane that is parallel to the plane of the sensor array and spaced slightly above it, such that, when these first recess alignment features 34' are abutted against their corresponding first distal end alignment features 34 on the projections 30, the plane 12 of the sensor array 10 will be positioned coplanar with the focal plane of the lens 3.

Similarly, the recesses 42 contain second mechanical alignment features 36' complementary to the second mechanical alignment features 36 located on the distal ends 32 of the projections 30, namely, the inner wall surfaces of the recesses 42. Thus, when the second recess features 36' are milled at the appropriate radial distances relative to the absolute location of the center 14 of the sensor array 10, and at appropriate angular positions relative to the absolute angular locations of the horizontal and vertical axes H and Z of the array 10, respectively, then when corresponding pairs of the second distal end alignment features 36 and the second recess alignment features 36' are engaged with each other, the center 14 of the sensor array 10 will be positioned coincidentally with the optical axis Z of the lens 3, and the horizontal and vertical axes H and V of the sensor array 10 will be aligned with the horizontal and vertical axes H and V of a scene 1 imaged by the lens 3, respectively.

The method and apparatus of the present invention make it possible to fabricate cameras 4 (or other imaging devices), and sensor array packages 5 on separate lines and to assemble them interchangeably with each other, in precise optical alignment, in a simple, low-cost, high-volume operation. That operation is illustrated schematically in FIG. 6, in which the recesses comprise cylindrical bores 42', and in FIG. 7, in which the recesses comprise slots 42", both types milled into the margins of the transparent window 26. Permanent mounting of the sensor package 5 to and in optical alignment with the lens 3 can be achieved, for example, by simply applying a small amount of a suitable adhesive, e.g., cyanoacrylate, onto the distal ends 32 of the projections 30, then pressing the package 5 onto the projections 30 such that the distal ends 32 of the projections 30 engage and bottom out in the corresponding recesses 32, and holding the package 5 in that position until the adhesive cures.

In this regard, it may be noted that, in the case where corresponding pairs of the projections 30 and the recesses 42 are located radially symmetrical to the Z axis of the lens 3 and the sensor array 10, it is possible to mount the sensor package 5 in several possible orientations relative to the lens 3. Thus, for three pairs of projections and corresponding recesses disposed in an equilateral triangular pattern about the Z axis, for example, it is possible to mount the sensor package 5 to the lens 3 in three, distinct, relative angular orientations. Since only one of these will result in the correct alignment of the sensor array 10 relative to the lens 3 and the scene 1, some provision should be made to prevent the occurrence of an inadvertent misalignment during assembly.

One way to achieve this is to color-code at least one of the distal ends 32 of the projections 30 and its corresponding recess 42 such that their specific correspondence is visually apparent. However, such a method is not fail-safe. Another, fail-safe way to prevent the problem is to position corresponding pairs of projections 30 and recesses 42 in a pattern that is radially asymmetrical, or at best, only bilaterally symmetrical, about the Z axis of the lens 3, such that the sensor package 5 can be assembled to the lens 3 in only one relative orientation. A third, fail-safe method is to "key" one pair of corresponding distal ends 32 and recesses 42 to each other, such as by providing them with a different cross-sectional shape than the other pairs, so that they can engage only with each other and with none of the other mounting features.

By now, it will be evident to those skilled in the art that many variations of the methods and apparatus of this invention are possible, depending on the particular problem at hand.

For example, it may be seen that, in the case of a sensor package 5 having a round window 42, it is possible to substitute an annular sleeve mounted coaxially on the lens 3 for the plurality of projections 30 thereon, and to mill an annular shoulder, or rabbet, into the face of the round window around its periphery, in place of the plurality of recesses milled into the margins of the rectangular window. Provided the above teachings are adhered to, when the cylindrical step in the window is inserted into the sleeve on the lens, and the shoulder milled into the window is abutted against the distal end of the sleeve, the plane of the sensor will be coplanar with the focal plane of the lens, and the sensor array will be centered on its optical axis. Of course, it is also necessary to provide an additional pair of complementary engaging features that are located at appropriate radial positions, such as a key on the shoulder of the window and a complementary slot in the sleeve, to ensure that the horizontal and vertical axes of the sensor array and the imaged scene are also respectively aligned.

As another example, it may be observed that, in the exemplary embodiments illustrated and described herein, the recesses 42 are milled into the window 26 of the sensor package 5. However, it will be understood by those skilled in the art that it is possible to mill the recesses into an underlying substrate, such as the PCB 20 shown in the figures, to which the sensor package 5 is mounted, provided, however, that the sensor package 5 must be mounted immovably to the substrate 20 before the recesses 42 are milled into the latter. When the sensor package 5 is thus firmly mounted to the substrate 20, the substrate can then be deemed an integral part of the sensor array "package," and in such an embodiment, the substrate 20 can be provided with an appropriate number of oversized standoffs located outboard of the sensor package 5 into which the recesses 42 are milled.

As yet another example, it should be noted that, because of the planar nature of the sensor array 10, the exemplary embodiments illustrated and described herein have been given with respect to a cylindrical coordinate system and two-dimensional image sensing devices, such as video cameras. However, it should be understood that the principals of this invention are equally applicable to a Cartesian coordinate system and simpler, one-dimensional devices, such as line or film scanners, and even to "point" imaging systems, such as a light detecting diode.

In light of the above, the embodiments illustrated and described herein should be taken as exemplary in nature only, and not in any sense as limitations of the scope of this invention, which is defined by the claims appended hereafter.

What is claimed is:

1. A method for mounting a packaged optical sensor array to a lens in optical alignment therewith, comprising:

attaching a fixture to the lens, the fixture having mounting features on it located at predetermined positions measured relative to a focal plane of the lens, an optical axis of the lens, and horizontal and vertical axes of a scene imaged by the lens;

finding the absolute locations of a plane, a center, and horizontal and vertical axes of the sensor array within the sensor package; and, forming corresponding, complementary mounting features in the package of the sensor array at positions measured relative to the absolute locations found of the plane, the center, and the horizontal and vertical axes of the sensor array, said positions corresponding to said predetermined positions of the mounting features measured relative to the focal plane of the lens, the optical axis of the lens, and the horizontal and vertical axes of the scene imaged by the lens, respectively, such that, when the mounting features on the fixture are engaged with the corresponding, complementary mounting features in the package of the sensor array, the sensor array is held mounted to the lens, with the plane of the sensor array coplanar with the focal plane of the lens, the center of the sensor array coincident with the optical axis of the lens, and the horizontal and vertical axes of the sensor array aligned with the respective horizontal and vertical axes of the scene imaged by the lens.

2. The method of claim 1, wherein finding the absolute locations of the plane, the center, and the horizontal and vertical axes of the sensor array comprises scanning the sensor array within the sensor package using automated pattern recognition apparatus to find at least one of said locations.

3. The method of claim 2, wherein forming the corresponding, complementary mounting features in the sensor array package comprises milling said mounting features into the package of the sensor array at said measured positions using computer-controlled milling apparatus positioned in accordance with said absolute sensor array feature locations found by said automated pattern recognition apparatus.

4. The method of claim 3, further comprising:

mounting a plurality of projections on the lens at distinct, predetermined polar coordinates measured relative to the optical axis of the lens and the horizontal and vertical axes of a scene imaged by the lens, the projections extending outward from the lens toward the focal plane of the lens and in a direction parallel to the optical axis thereof, each projection having a distal end; and, milling a plurality of recesses into the package of the sensor array at polar coordinates measured relative to the center and the horizontal and vertical axes of the sensor array that correspond to said distinct, predetermined polar coordinates of said projections, respectively, the recesses being adapted to receive a corresponding one of the distal ends of the projections in a complementary engagement such that the sensor array is mounted to the lens, with the plane of the sensor array coplanar with the focal plane of the lens, the center of the sensor array coincident with the optical axis of the lens, and the horizontal and vertical axes of the sensor array aligned with the respective horizontal and vertical axes of a scene imaged by the lens.

5. The method of claim 4, further comprising:
providing a first alignment feature on each of the distal ends of the projections that, in combination with the other ones of such first distal end alignment features, defines a first plane that is parallel to the focal plane of the lens;

forming a first corresponding, complementary alignment feature in each of the recesses that, in combination with the other ones of such first recess alignment features, defines a second plane that is parallel to the plane of the sensor array; and, controlling the depth of the first recess alignment features such that, when corresponding pairs of the first distal end alignment features and the first recess alignment features are engaged with each other, the plane of the sensor array is coplanar with the focal plane of the lens.

6. The method of claim 4, further comprising:
providing a second alignment feature on each of the distal ends of the projections that is located a predetermined radial distance from the optical axis of the lens; and, forming a second, corresponding, complementary alignment feature in each of the recesses that is located at the same, predetermined radial distance from the center of the sensor array such that, when corresponding pairs of the second distal end alignment features and the second recess alignment features are engaged with each other, the center of the sensor array is positioned coincident with the optical axis of the lens.

7. The method of claim 4, further comprising:
providing a second alignment feature on each of the distal ends of the projections that is oriented at a predetermined angular position relative to the horizontal and vertical axes of the scene imaged by the lens; and, forming a second, corresponding, complementary alignment feature in each of the recesses that is located at the same, predetermined angular orientation relative to the horizontal and vertical axes of the sensor array such that, when corresponding pairs of the second distal end alignment features and the second, complementary recess alignment features are engaged with each other, the horizontal and vertical axes of the sensor array are aligned with the horizontal and vertical axes of the scene imaged by the lens, respectively.

8. The method of claim 4, further comprising locating corresponding pairs of the projections and the recesses at radially asymmetrical positions relative to the optical axis of the lens and the center of the sensor array, respectively, such that the sensor array can be mounted to the lens in only one orientation relative thereto.

9. The method of claim 4, wherein corresponding pairs of the projections and the recesses are located at radially symmetrical positions relative to the optical axis of the lens and the center of the sensor array, respectively, and further comprising keying one of the corresponding pairs of the projections and the recesses uniquely to each other such that the sensor array can be mounted to the lens in only one orientation relative thereto.

10. The method of claim 4, wherein the sensor array package comprises a transparent window overlying the sensor array, and wherein milling the recesses into the package of the sensor array comprises milling the recesses into a margin of the window.

11. The method of claim 10, wherein each of the recesses comprises a slot or a bore milled into the margin of the window.

12. Apparatus for mounting a packaged optical sensor array to a lens in optical alignment therewith, comprising:

a fixture attached to the lens for mounting the package of the sensor array to the lens, the fixture comprising a plurality of mounting features located at predetermined positions measured relative to a focal plane of the lens, an optical axis of the lens, and horizontal and vertical axes of a scene imaged by the lens; and, corresponding, complementary mounting features formed in the package of the sensor array at positions measured relative to the absolute locations of the plane, the center, and horizontal and vertical axes of the sensor array in the package, said positions corresponding to said predetermined positions of the mounting features on the fixture measured relative to the focal plane of the lens, the optical axis of the lens, and the horizontal and vertical axes of a scene imaged by the lens, respectively, such that, when the mounting features on the fixture are engaged with the corresponding, complementary mounting features in the package of the sensor array, the sensor array is held mounted to the lens, with the plane of the sensor array coplanar with the focal plane of the lens, the center of the sensor array coincident with the optical axis of the lens, and the horizontal and vertical axes of the sensor array aligned with the respective horizontal and vertical axes of the scene imaged by the lens.

13. The apparatus of claim 12, further comprising automated pattern recognition apparatus for finding at least one of said absolute locations of the plane, the center, and the horizontal and vertical axes of the sensor array within the package.

14. The apparatus of claim 13, further comprising computer-controlled milling apparatus for milling said mounting features into the package of the sensor array at said measured positions and positioned in accordance with said absolute sensor array feature locations found by said automated pattern recognition apparatus.

15. The apparatus of claim 12, further comprising:
a plurality of projections mounted on the lens at distinct, predetermined polar coordinates measured relative to the optical axis of the lens and the horizontal and vertical axes of a scene imaged by the lens, the projections extending outward from the lens toward the focal plane of the lens and in a direction parallel to the optical axis thereof, each projection having a distal end; and, a plurality of recesses milled into the package of the sensor array at polar coordinates measured relative to the center and the horizontal and vertical axes of the sensor array that correspond to said distinct, predetermined polar coordinates of said projections, respectively, the recesses being adapted to receive a corresponding one of the distal ends of the projections in a complementary engagement such that the sensor array is mounted to the lens, with the plane of the sensor array coplanar with the focal plane of the lens, the center of the sensor array coincident with the optical axis of the lens, and the horizontal and vertical axes of the sensor array aligned with the respective horizontal and vertical axes of a scene imaged by the lens.

16. The apparatus of claim 15, further comprising:
a first alignment feature provided on each of the distal ends of the projections that, in combination with the other ones of such first distal end alignment features, defines a first plane that is parallel to the focal plane of the lens;

a first corresponding, complementary alignment feature formed in each of the recesses that, in combination with the other ones of such first recess alignment features, defines a second plane that is parallel to the plane of the sensor array, the first recess alignment features having a depth that is controlled such that, when corresponding pairs of the first distal end alignment features and the first recess alignment features are engaged with each other, the plane of the sensor array is coplanar with the focal plane of the lens.

17. The apparatus of claim 15, further comprising:

a second alignment feature provided on each of the distal ends of the projections that is located a predetermined radial distance from the optical axis of the lens; and, a second, corresponding, complementary alignment feature formed in each of the recesses that is located at the same, predetermined radial distance from the center of the sensor array such that, when corresponding pairs of the second distal end alignment features and the second recess alignment features are engaged with each other, the center of the sensor array is positioned coincident with the optical axis of the lens.

18. The apparatus of claim 15, further comprising:

a second alignment feature provided on each of the distal ends of the projections that is oriented at a predetermined angular position relative to the horizontal and vertical axes of the scene imaged by the lens; and, a second, corresponding, complementary alignment feature formed in each of the recesses that is located at the same, predetermined angular orientation relative to the horizontal and vertical axes of the sensor array such that, when corresponding pairs of the second distal end alignment features and the second, complementary recess alignment features are engaged with each other, the horizontal and vertical axes of the sensor array are aligned with the horizontal and vertical axes of the scene imaged by the lens, respectively.

19. The apparatus of claim 15, wherein corresponding pairs of the projections and the recesses are located at radially asymmetrical positions relative to the optical axis of the lens and the center of the sensor array, respectively, such that the sensor array can be mounted to the lens in only one orientation relative thereto.

20. The apparatus of claim 15, wherein corresponding pairs of the projections and the recesses are located at radially symmetrical positions relative to the optical axis of the lens and the center of the sensor array, respectively, and wherein one of the corresponding pairs of the projections and the recesses are keyed uniquely to each other such that the sensor array can be mounted to the lens in only one orientation relative thereto.

21. A method for manufacturing a packaged optical sensor array of the type that includes a substrate, a semiconductor chip mounted on the substrate, a planar photo sensor array formed on an upper surface of the chip, the array having a center and horizontal and vertical axes, and a transparent window through which the sensor array is exposed to incident light, the method comprising:

finding the absolute locations of the plane, the center, and the horizontal and vertical axes of the sensor array independently of any mechanical features of the sensor package; and, forming mounting features in the package at positions measured relative to the absolute locations found of the plane, the center, and the horizontal and vertical axes of the sensor array.

22. The method of claim 21, wherein forming the mounting features in the package comprises milling a plurality of recesses into the package at positions measured relative to the absolute locations found of the plane, the center, and the horizontal and vertical axes of the sensor array.

23. The method of claim 21, wherein finding the absolute locations of the plane, the center and the horizontal and vertical axes of the sensor array comprises finding at least one of said features automatically with computer-controlled optical pattern recognition apparatus.

24. The method of claim 22, wherein milling a plurality of recesses into the package comprises milling said recesses into said package with computer-controlled milling apparatus positioned in accordance with the absolute locations found of the plane, the center, and the horizontal and vertical axes of the sensor array.

25. The method of claim 22, wherein each of the recesses is formed to include a first alignment feature that is located in a plane parallel to the plane of the sensor array.

26. The method of claim 22, wherein each of the recesses is formed to include a second alignment feature that is located at a predetermined radial distance from the center of the sensor array.

27. The method of claim 22, wherein each of the recesses is formed to include a second alignment feature that is located at a predetermined angular orientation relative to the horizontal and vertical axes of the sensor array.

28. A packaged optical sensor array, comprising:

a substrate;

a semiconductor chip mounted on the substrate, the chip having a planar photo sensor array formed on an upper surface of the chip, the array having a center and horizontal and vertical axes;

a transparent window through which the sensor array is exposed to incident light; and, mounting features formed in the package of the sensor array at positions measured relative to the absolute locations of the plane, the center, and the horizontal and vertical axes of the sensor array within the package.

29. The packaged optical sensor array of claim 28, wherein the mounting features comprise a plurality of recesses milled into the package of the sensor array.

30. The packaged optical sensor array of claim 29, wherein each of the recesses includes a first alignment feature that is located in a plane parallel to the plane of the sensor array.

31. The packaged optical sensor array of claim 29, wherein each of the recesses includes a second alignment feature that is located at a predetermined radial distance from the center of the sensor array.

32. The packaged optical sensor array of claim 29, wherein each of the recesses includes a second alignment feature that is located at a predetermined angular orientation relative to the horizontal and vertical axes of the sensor array.

33. The packaged optical sensor array of claim 29, wherein the recesses comprise slots or bores milled into the window of the package.

34. The packaged optical sensor array of claim 29, wherein the recesses are located at bilaterally symmetrical positions relative to the center of the sensor array.

* * * * *